(12) United States Patent
Albini et al.

(10) Patent No.: US 8,918,594 B2
(45) Date of Patent: Dec. 23, 2014

(54) MULTI-INTERFACE MEMORY WITH ACCESS CONTROL

(75) Inventors: Giulio Albini, Milan (IT); Emanuele Confalonieri, Milan (IT); Francesco Mastroianni, Milan (IT)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 12/947,785

(22) Filed: Nov. 16, 2010

(65) Prior Publication Data

US 2012/0124313 A1    May 17, 2012

(51) Int. Cl.
*G06F 13/16* (2006.01)
*G11C 7/10* (2006.01)
*G11C 8/16* (2006.01)

(52) U.S. Cl.
CPC .......... *G11C 7/1075* (2013.01); *G06F 13/1663* (2013.01); *G11C 8/16* (2013.01)
USPC ........................... 711/149; 711/156; 710/116

(58) Field of Classification Search
None
See application file for complete search history.

(56) References Cited

U.S. PATENT DOCUMENTS

| | | | |
|---|---|---|---|
| 4,541,075 A | | 9/1985 | Dill et al. |
| 4,698,753 A * | | 10/1987 | Hubbins et al. ............... 709/209 |
| 4,937,781 A * | | 6/1990 | Lee et al. ....................... 711/149 |
| 5,276,842 A | | 1/1994 | Sugita |
| 5,671,393 A | | 9/1997 | Yamaki |
| 5,845,130 A * | | 12/1998 | Goff et al. ..................... 710/240 |
| 6,108,756 A * | | 8/2000 | Miller et al. ................... 711/148 |
| 6,122,706 A * | | 9/2000 | Leong et al. ................... 711/108 |
| 6,253,293 B1 * | | 6/2001 | Rao et al. ....................... 711/147 |
| 6,381,671 B1 * | | 4/2002 | Ayukawa et al. ............. 711/104 |
| 6,704,847 B1 * | | 3/2004 | Six et al. ........................ 711/151 |
| 7,039,737 B1 * | | 5/2006 | Dorr et al. ..................... 710/240 |
| 8,254,199 B1 | | 8/2012 | Confalonieri |
| 2007/0073937 A1 * | | 3/2007 | Feinberg et al. ................ 710/62 |
| 2008/0010643 A1 * | | 1/2008 | Oohira et al. ................. 718/102 |
| 2008/0077937 A1 | | 3/2008 | Shin et al. |
| 2009/0043920 A1 * | | 2/2009 | Kuris et al. ..................... 710/28 |
| 2009/0248993 A1 * | | 10/2009 | Miura et al. ................... 711/149 |
| 2010/0070691 A1 * | | 3/2010 | Kwon ............................ 711/103 |
| 2012/0226880 A1 * | | 9/2012 | Albini et al. .................. 711/163 |

FOREIGN PATENT DOCUMENTS

| | | |
|---|---|---|
| CN | 1975928 A | 6/2007 |
| JP | 2008-034095 | 2/2008 |
| JP | 2009-237980 | 10/2009 |
| KR | 10-2006-0090083 | 8/2006 |
| KR | 10-2008-0072412 | 8/2008 |
| KR | 10-2009-0103070 | 10/2009 |

OTHER PUBLICATIONS

Benjamin C. Lee et al. "Architecting Phase Change Memory as a Scalable DRAM Alternative." Jun. 2009. ACM. ISCA '09. pp. 2-13.*

(Continued)

*Primary Examiner* — Nathan Sadler
(74) *Attorney, Agent, or Firm* — Knobbe Martens Olson & Bear LLP

(57) ABSTRACT

Apparatus and methods disclose techniques to control access to a memory array. The memory array can be accessed by either a first interface or a second interface. A switch register grants privilege levels, which control access. For example, a high privilege level can grant access and a low privilege level can deny access. A status register indicates when an interface with a high privilege level is busy accessing the memory array.

20 Claims, 4 Drawing Sheets

(56) References Cited

OTHER PUBLICATIONS

U.S. Appl. No. 12/648,762, filed Dec. 29, 2009, 34 pages.
German Patent Office; Office Action dated Oct. 25, 2013, from related application German Patent Application No. 102011086097.5.
Japanese Patent Office; Office Action dated Jul. 30, 2013, from related application Japanese Patent Application No. 2011-222240.
Chinese Patent Office; Office Action dated Jan. 10, 2014, from related Application Chinese Patent Application No. 201110370057.7.
Taiwanese Patent Office; Office Action dated Apr. 24, 2014, from related application Taiwanese Patent Application No. 100137016.
Lee, et al.; Architecting Phase Change Memory as a Scalable DRAM Alternative; ISCA 2009: Proceedings of the 36$^{th}$ Annual International Symposium on Computer Architecture; pp. 2-13; New York, NY, USA; 2009.
Japanese Patent Office; Office Action dated Apr. 15, 2014, from related application Japanese Patent Application No. 2011-222240.

* cited by examiner

MULTI-INTERFACE MEMORY WITH ACCESS CONTROL

BACKGROUND

1. Field

Subject matter disclosed herein relates to a memory device, and more particularly to a multi-channel memory device and methods of selecting one or more channels of same.

2. Information

In response to demands for faster, more efficient computer processing systems, attention has been directed to increasing throughput in many levels of such systems. For example, one such level may comprise a memory system, wherein a processor may generate read/write requests at a rate faster than the memory system can handle. Accordingly, techniques for dealing with such operating capability imbalances have led to development of multi-channel memory devices. Generally, a dual-channel memory device may incorporate two parallel channels to operate simultaneously to reduce latency involving memory read/write operations, for example. In particular, a memory controller may transmit and/or receive addressed read/write data to/from multiple memory arrays via two separate, parallel channels. Similarly, two separate, parallel host interfaces may be electronically connected to respective channels of a dual-channel memory device.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
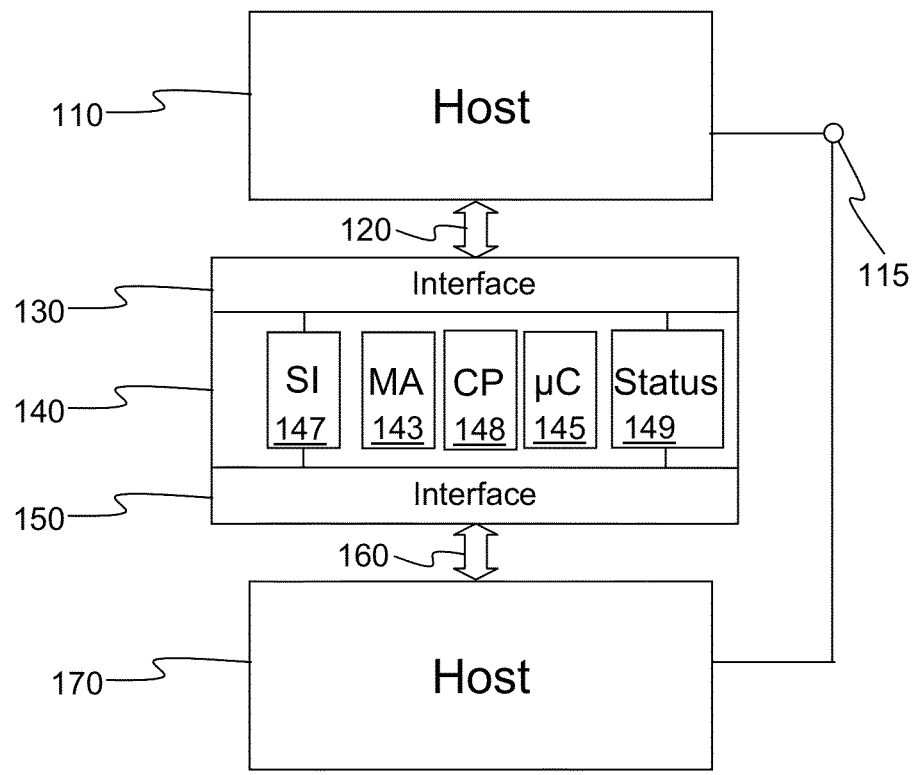
FIG. 1 is a schematic diagram showing a dual-channel memory system, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a non-volatile multi-channel memory device may communicate with two hosts' processors through two associated interfaces. Such interfaces may comprise parallel and/or serial interfaces, for example. In one particular implementation, a first host may comprise a baseband processor of a mobile communication device, whereas a second host may comprise an external processor connected with the mobile communication device through a wireless interface. In such an implementation, a dual-channel memory device may communicate with the baseband processor through a first interface and with the external processor through a second interface. Control logic or other circuitry may be connected between such a second interface and a radio frequency (RF) interface to allow such an external processor to communicate with the memory device through an air interface.

In an embodiment, interfaces or channels of a non-volatile multi-channel memory device, such as that described above, may be managed to avoid contention of memory access between or among two or more processors attempting to access the memory device via the interfaces. Embodiments described herein include techniques and architecture to allow individual interfaces particular privilege levels to access memory while keeping the individual interfaces active. In an implementation, an active interface may comprise an interface that is enabled or in an on-state (e.g., a powered-on state), whereas a non-active interface may comprise an interface that is disabled or in an off-state (e.g., a powered-off state), for example.

For example, contents of a register within a multi-channel memory device may indicate to the memory device one or more privilege levels assigned to individual interfaces. For example, an interface having a particular privilege level may have access to one or more registers of the memory device, but not have access to a memory array of the memory device. As another example, an interface having a particular privilege level may have access to one or more registers of the memory device and also have access to the memory array, as described in further detail below.

In a particular implementation of a multi-channel memory device, a switch interface (SI) register embedded in a memory device may be used in techniques to manage privilege levels of multiple interfaces. In one implementation, such a SI register may be accessible via the multiple interfaces regardless of privilege level attributed to the interfaces. In particular, any interface privilege level may allow access to a SI register, whereas only a particular privilege level may allow access to the memory array. For example, as a result of transitioning one or more bits of a SI register (e.g., from low to high or from high to low), one or more interfaces may transition from one privilege level to another privilege level. In a particular implementation, transitioning a bit of a SI register may result in one interface transitioning to a relatively high privilege level (e.g., enabling access to a memory array) while another interface transitions to a relatively low privilege level (e.g., having no access to the memory array). Regardless of such various privilege levels, the interfaces may concurrently remain in enabled states. In one implementation, before a state and/or bit of a SI register may be changed (e.g., before privilege levels of particular interfaces may be changed), an interface requesting a different privilege level to access the memory may first determine whether there are unfinished processes initiated by the other interface. Such a determination may be made by reading contents of a status register (wherein the busy state of the higher level interface may be indicated), which may be read by the interfaces, regardless of the privilege level of the interfaces. In one implementation, status register contents may comprise state machine busy bits (e.g., for pending erase or write operations). In particular, in a dual-channel memory, either interface may read such a status register at any time, whereas only the interface having a relatively high privilege level to access the memory array may write to the status register. Of course, such details of operating a dual-channel memory device are merely examples, and claimed subject matter is not so limited.

In an embodiment, a non-volatile dual-channel memory device architecture may include a memory cell array, a first interface to provide access to the memory cell array through a first channel, and a second interface to provide access to the memory cell array through a second channel. Such an architecture may further include a SI register, as described above, for example. Such a SI register may be accessed through the first interface and the second interface. Such an architecture may maintain the first interface and the second interface in enabled states. In an implementation, a privilege level of access to the memory cell array granted to either interface may be based, at least in part, on contents in the SI register. In one implementation, a non-volatile multi-channel memory device may comprise a status register accessible through a first interface and a second interface, wherein the busy state of the higher level interface may be indicated by contents in the status register. Such a status register and/or SI register may comprise a portion of memory cell array in the memory device. In one implementation, an interface having a relatively high privilege level may be permitted to write to the status register, whereas other interfaces having a relatively low privilege level may not be permitted to write to the status register.

FIG. 1 is a schematic diagram showing a system 100, according to an embodiment. For simplicity of explanation, system 100 employs a dual-channel memory device 140. However, systems employing memory devices with three or more channels may be used without deviating from claimed subject matter. Dual-channel memory device 140 may comprise a first interface 130 and a second interface 150 on a first channel and on a second channel, respectively. In a particular implementation, a memory device with three or more channels may include three or more associated interfaces. A first host 110 may be electronically connected via bus 120 to first interface 130. Similarly, a second host 170 may be electronically connected via bus 160 to second interface 150. Dual-channel memory device 140 may comprise a phase change memory (PCM) and/or flash memory, volatile or nonvolatile memory, though claimed subject matter is not limited to such examples. For example, dual-channel memory device 140 may comprise a memory array 143 that includes a plurality of memory cells such as PCM memory cells and a microcontroller 145. Such a microcontroller may be used to manage privilege levels of first interface 130 and second interface 150 to selectively allow communication between dual-channel memory device 140 and host 110 or host 170. In a particular implementation, microcontroller 145 may use a SI register 147, which may be embedded in memory array 143. First interface 130 and second interface 150 may be used to access (e.g., write to or read from) SI register 147 without regard to privilege levels attributed to interfaces 130 and 150. For example, as a result of a bit of SI register 147 being set low or high, first interface 130 may gain a relatively high privilege level to access memory array 143, whereas second interface 150 may have a relatively low privilege level without access to memory array 143. In one implementation, before a state and/or bit of SI register 147 may be changed (e.g., before privilege level of particular interfaces may be changed), one interface requesting increased privilege level to access memory array 143 may first determine whether there are unfinished processes initiated by the other interface. Such a determination may be made by reading contents of status register 149, which may be read by either interface, regardless of the privilege level of either interface. In one implementation, first interface 130 and second interface 150 may comprise identical or different types of interfaces. For example, such interfaces may comprise non-standard or standard interfaces such as a double data rate (DDR) interface, a DDR2 interface, an A/D MUX interface, and/or an open NAND flash interface (ONFI), just to name a few examples.

In one particular embodiment, system 100 may include a first host 110 comprising a baseband processor included in a mobile device and a second host 170 comprising an external processor wirelessly connected to the mobile device via a wireless interface. Accordingly memory device 140 may communicate with the baseband processor through first interface 130 and with the external processor through second interface 150. Of course such details of system 100 are merely examples, and claimed subject matter is not so limited.

Returning to FIG. 1, a single power supply 115 may provide an operating voltage to first host 110 and second host 170. In one particular implementation, power supply 115 may comprise a rechargeable battery providing a nominal 1.8 volts, for example. In another particular implementation, power supply 115 may comprise a voltage generated from an external source. In yet another implementation, memory device 140 may include one or more charge pumps 148 to provide relatively high voltage to support program/erase operations in memory device 140. Of course claimed subject matter is not so limited to use of any particular type of power supply.

Figure 2:
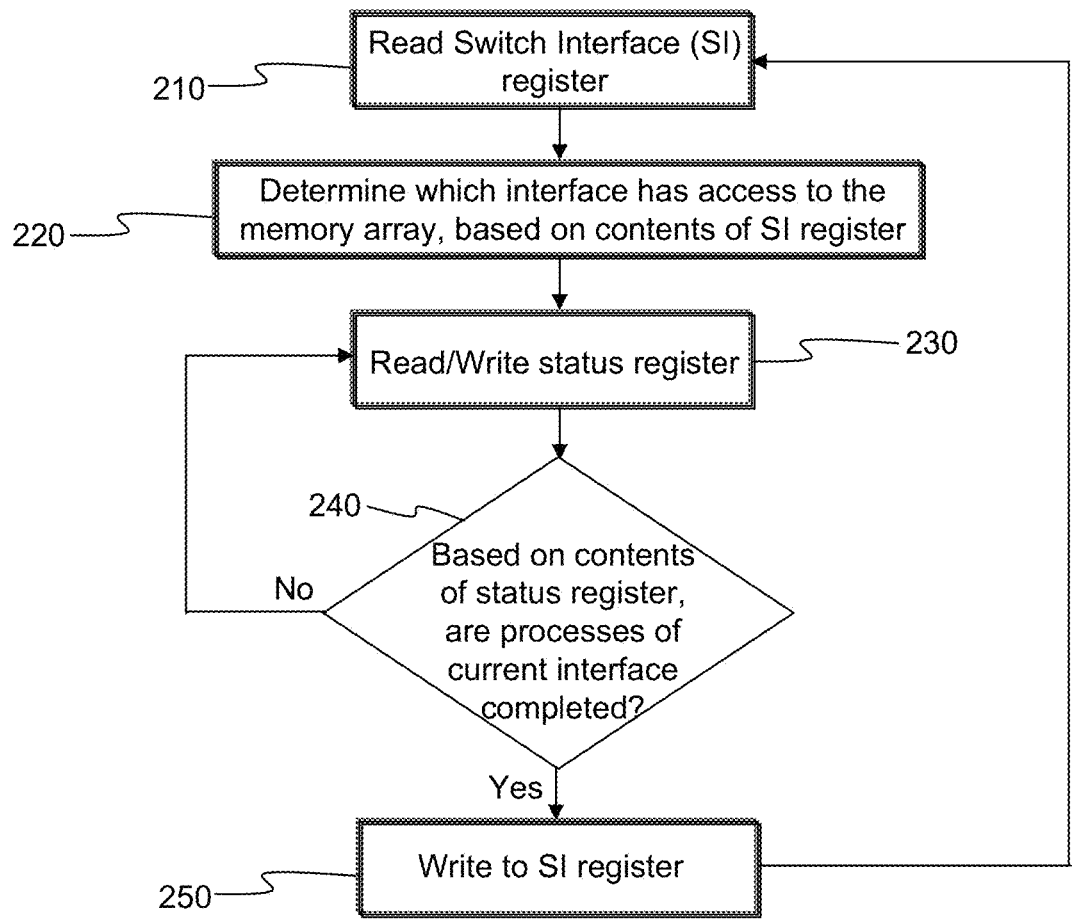
FIG. 2 is a flow diagram of a process for operating a dual-channel memory, according to an embodiment.

FIG. 2 is a flow diagram of a process 200 for operating a dual-channel memory, according to an embodiment. As mentioned above, a privilege level granted to a particular interface of a dual-channel memory may be determined based, at least in part, on contents of a SI register. It should be noted that although embodiments described herein include a dual-channel memory having two channels, and thus two interfaces, claimed subject matter is not limited to two such channels and/or interfaces. For example, process 200 may be extended to a case where three or more power supplies, channels, and/or interfaces may be involved. Thus, process 200 is merely an illustrative example involving a dual-channel memory and associated architecture including two interfaces, two processors, and so on.

At block 210, contents of a SI register may be read. At block 220, such contents may be used to determine privilege levels of both interfaces. Such contents may comprise one or more binary or multi-level bits, for example. In an implementation, an interface having a relatively low privilege level may not have access to a memory array of the memory. Table 1 describes transitions of first interface I/F1 and second interface I/F2 between privilege levels based, at least in part, on contents and/or logic level of a SI register, for a particular implementation.

TABLE 1

| transition | I/F 1, initial privilege level | I/F 2, initial privilege level | I/F 1, re-quest | I/F 2, re-quest | I/F 1, final privilege level | I/F 2, final privilege level |
| --- | --- | --- | --- | --- | --- | --- |
| 1 | low | high | SI set low | — | high | low |
| 2 | high | low | SI set high | — | low | high |
| 3 | low | high | — | SI set high | high | low |
| 4 | high | low | — | SI set low | low | high |

Describing Table 1, transition 1 includes the case where first interface I/F1 initially has a low privilege level, second interface I/F2 initially has a high privilege level, and first interface I/F1 requests to have a high privilege level (by setting SI register to a low state). As a result, first interface I/F1 subsequently has a high privilege level and second interface I/F2 subsequently has a low privilege level. Transition 2 includes the case where first interface I/F1 initially has a high privilege level, second interface I/F2 initially has a low privilege level, and first interface I/F1 requests to have a low privilege level (by setting SI register to a high state). As a result, first interface I/F1 subsequently has a low privilege level and second interface I/F2 subsequently has a high privilege level. Transition 3 includes the case where first interface I/F1 initially has a low privilege level, second interface I/F2 initially has a high privilege level, and second interface I/F2 requests to have a low privilege level (by setting SI register to a high state). As a result, first interface I/F1 subsequently has a high privilege level and second interface I/F2 subsequently has a low privilege level. Transition 4 includes the case where first interface I/F1 initially has a high privilege level, second interface I/F2 initially has a low privilege level, and second interface I/F2 requests to have a high privilege level (by setting SI register to a low state). As a result, first interface I/F1 subsequently has a low privilege level and second interface I/F2 subsequently has a high privilege level.

An interface having a low privilege level may request to have a high privilege level, as expressed in transitions 1 and 4 in table 1, for example. Such a request may involve reading contents and/or a state of a status register, as at block 230. Contents and/or state of such a status register may indicate whether or not one or more processes initiated by an interface having a high privilege level are completed. An interface in either high or low privilege levels may read the status register. An interface having a low privilege level, however, may not write to the status register. In contrast, an interface having a high privilege level may write to the status register. Accordingly, an interface having a high privilege level may write to the status register upon completion of processes initiated by the interface having the high privilege level. At block 240, a determination may be made, based at least in part on contents and/or a state of a status register, as to whether one or more processes initiated by the interface having a high privilege level are completed. If the one or more processes are not completed, then process 200 may return to block 230 where the status register may be monitored while one or more processes initiated by the interface having a high privilege level are given time for completion. If the status register indicates that such processes are completed, process 200 may proceed to block 250, where the interface most recently granted a high privilege level may write to the SI register to indicate that it now has a high privilege level. Subsequently, process 200 may return to block 210 where contents of the SI register may be read to determine privilege levels of the interfaces.

As discussed above, a SI register may be accessed by both interfaces. However, possible simultaneous accesses may undesirably generate a contention. In an embodiment, such contentions may be resolved by assigning priority to the interfaces. For example, a first interface may be assigned highest priority while a second interface may be assigned a lowest priority. As discussed above, transitions of first interface I/F1 and second interface I/F2 between privilege levels may be based, at least in part, on contents and/or logic level of a SI register. Table 2 describes examples of simultaneous requests to have a high privilege level from first interface I/F1 and second interface I/F2. In the case of Table 2, first interface I/F1 is assigned highest priority over second interface I/F2. In the examples shown in Table 2, contents of SI register being "0" indicate a high privilege level, while "1" indicates a low privilege level.

TABLE 2

| SI target value | | |
|---|---|---|
| Request from I/F 1 | Request from I/F 2 | SI register final content |
| 0 | 0 | 0 |
| 0 | 1 | 0 |
| 1 | 0 | 1 |
| 1 | 1 | 1 |

In the examples illustrated in Table 2, with first interface I/F1 having highest priority, regardless of requests from I/F2, final content of the SI register may correspond to requests from I/F1. For example, I/F1 may request to have a high privilege level by intending to write a "0" to the SI register. At the same time, I/F2 may also request to have a low privilege level by intending to write a "1" to the SI register (e.g., I/F2 has a high privilege level and wants to relinquish high privilege level to I/F1 since, for example, I/F2 may have finished its business). Since I/F1 is assigned priority over I/F2, the final content of the SI register may correspond to the request from I/F1 so that I/F1 is given a high privilege level, while the request from I/F2 is ignored.

Figure 3:
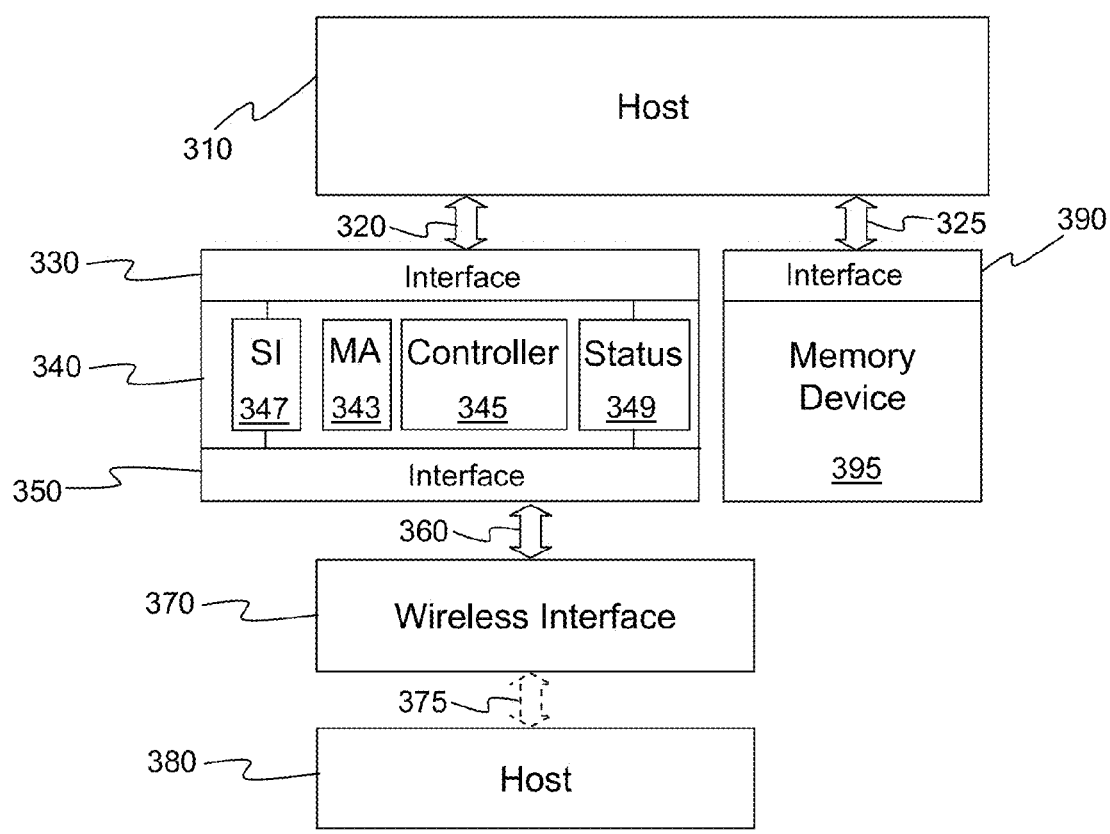
FIG. 3 is a schematic diagram of a dual-channel memory system, according to another embodiment.

FIG. 3 is a schematic diagram of a system 300, according to another embodiment. A dual-channel memory 340 may comprise a first interface 330 and a second interface 350 on a first channel and on a second channel, respectively. A first host 310 may be electronically connected to first interface 330 via bus 320. In a particular implementation, a second host 380 may be communicatively connected to a wireless interface 370 via a wireless connection 375. Such a wireless connection may involve any one of several communication standards such as Bluetooth, WiFi, and/or Ultra-wideband, just to name a few examples. Wireless interface 370 may be electronically connected to second interface 350 via bus 360. In one particular implementation, wireless interface 370 may comprise electronic circuitry to receive/transmit radio-frequency signals and/or infrared signals as well as process such signals. Dual-channel memory 340 may comprise PCM and/or flash memory, though claimed subject matter is not limited to such examples.

In one particular embodiment, system 300 may include a first host 310 comprising a baseband processor included in a mobile device and a second host 380 comprising an external processor wirelessly connected to the mobile device via a wireless interface. Accordingly, dual-channel memory 340 may communicate with the baseband processor through first interface 330 and with the external processor through second interface 350. System 300 may further include a second memory device 395, which may comprise DRAM, for example. First host 310 may communicate with second memory device 395 via bus 325 and second memory interface 390. Other memory devices may also be included in system 300, and claimed subject matter is not limited to a particular number and/or type of additional memory devices.

In one implementation, first interface 330 and second interface 350 may be assigned particular privilege levels based, at least in part, on management processes performed by a controller 345, for example. Such privilege levels may allow communication between dual-channel memory device 340 and either host 310 or host 380. In a particular implementation, to manage privilege levels that may enable access to memory array 343, a SI register 347 may be embedded in the memory array 343. First interface 330 and second interface 350 may access (e.g., write to or read from) SI register 347 without regard to their privilege level. For example, as a result of setting a bit of SI register 347 low or high, first interface 330 may transition to a relatively high privilege level to access memory array 343, whereas second interface 350 may have a relatively low privilege level and not be able to access memory array 343. In one implementation, before a state and/or bit of SI register 347 may be changed (e.g., before a privilege level of a particular interface may be changed), one interface requesting an increased privilege level to access memory array 343 may first determine whether there are unfinished processes initiated by the other interface. Such a determination may be made by reading contents of status register 349, which may be read by either interface, regardless of the privilege level of the interfaces. In one implementation, first interface 330 and second interface 350 may be simultaneously enabled, though claimed subject matter is not so limited. Also, first interface 330 and second interface 350 may comprise identical or different interfaces. For example, such interfaces may comprise non-standard or standard interfaces such as a double data rate (DDR) interface, a DDR2 interface, an A/D MUX interface, and/or an open NAND flash interface (ONFI), just to name a few examples.

Figure 4:
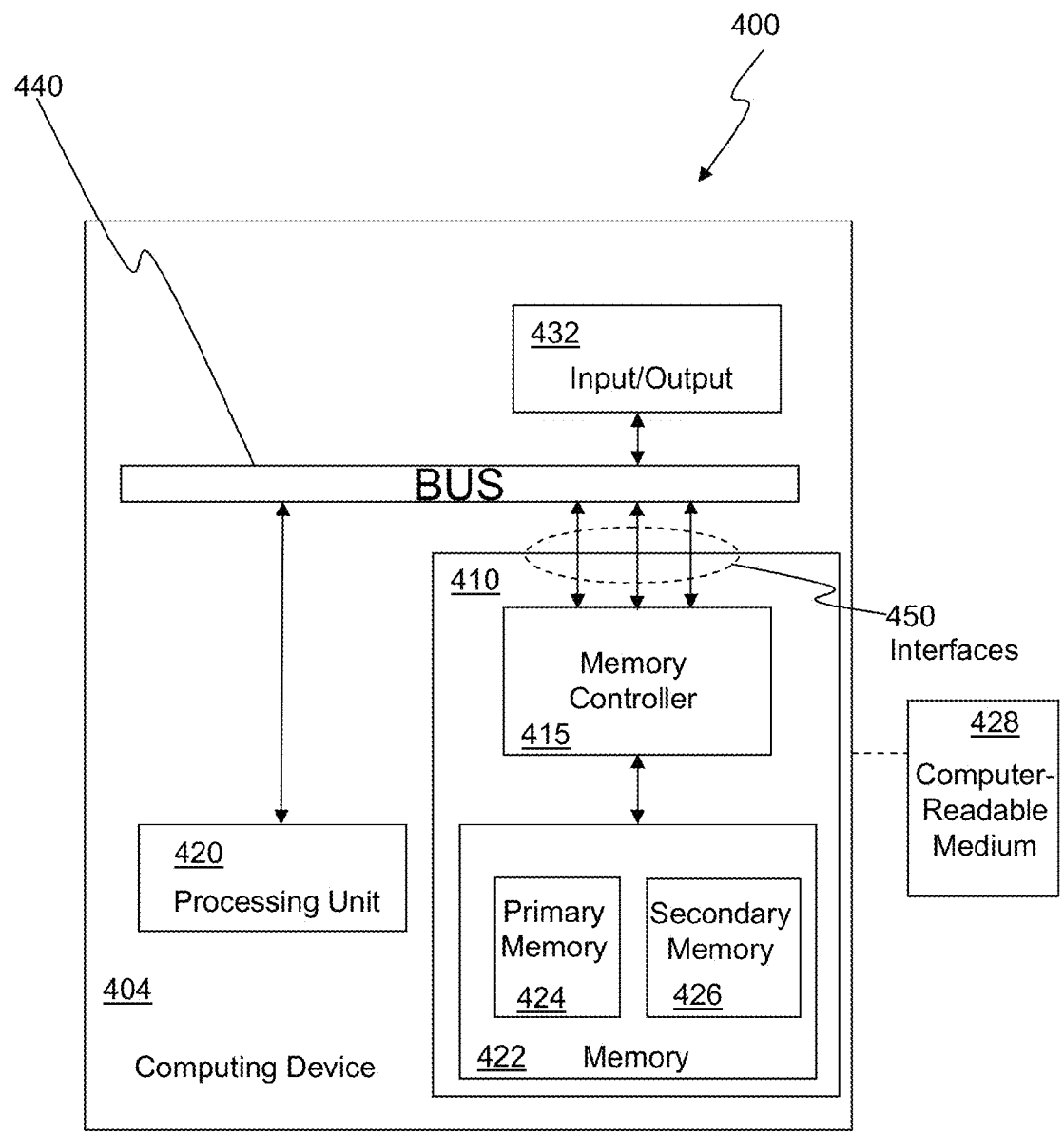
FIG. 4 is a schematic diagram of a computing system, according to an embodiment.

FIG. 4 is a schematic diagram illustrating an exemplary embodiment of a computing system 400 including a memory device 410. Such a computing device may comprise one or more processors, for example, to execute an application and/or other code. For example, memory device 410 may comprise a multi-channel memory such as dual-channel memory 140 shown in FIG. 1, for example. A computing device 404 may be representative of any device, appliance, or machine that may be configurable to manage memory device 410. Memory device 410 may include a memory controller 415 and a memory 422. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a PDA, mobile communication device, or the like; a computing system and/or associated service provider capability, such as, e.g., a database or data storage service provider/system; and/or any combination thereof.

It is recognized that all or part of the various devices shown in system 400, and the processes and methods as further described herein, may be implemented using or otherwise including hardware, firmware, software, or any combination thereof. Thus, by way of example but not limitation, computing device 404 may include at least one processing unit 420 that is operatively coupled to memory 422 through a bus 440, one or more channel interfaces 450, and a host or memory controller 415. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may include an operating system configured to communicate with memory controller 415. Such an operating system may, for example, generate commands to be sent to memory controller 415 over bus 440.

Memory 422 is representative of any data storage mechanism. Memory 422 may include, for example, a primary memory 424 and/or a secondary memory 426. Primary memory 424 may include, for example, a random access memory, read only memory, etc. While illustrated in this example as being separate from processing unit 420, it should be understood that all or part of primary memory 424 may be provided within or otherwise co-located/coupled with processing unit 420.

Secondary memory 426 may include, for example, the same or similar type of memory as primary memory and/or one or more data storage devices or systems, such as, for example, a disk drive, an optical disc drive, a tape drive, a solid state memory drive, etc. In certain implementations, secondary memory 426 may be operatively receptive of, or otherwise configurable to couple to, a computer-readable medium 428. Computer-readable medium 428 may include, for example, any medium that can carry and/or make accessible data, code, and/or instructions for one or more of the devices in system 400.

In an embodiment, computing system 400 may comprise a multi-channel memory device 410 that includes a memory controller 415 to concurrently maintain a first interface and a second interface in active states, wherein a privilege level assigned to the first interface and the second interface may be based, at least in part, on contents in a register in memory device 410. Computing system 400 may also include a processor to host one or more applications and to initiate commands to memory controller 415 to provide access to multi-channel memory device 410.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 432 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   a memory array;
   a first register;
   a second register;

a first interface configured to provide access to said memory array and write access to the second register for a first privilege level, but not for a second privilege level, configured to provide access to the first register regardless of privilege level, and configured to provide read access to the second register regardless of privilege level;

a second interface configured to provide access to said memory array and write access to the second register for the first privilege level, but not for the second privilege level, configured to provide access to the first register regardless of privilege level, and configured to provide read access to the second register regardless of privilege level; and a controller configured to concurrently maintain said first interface and said second interface in enabled states, wherein a privilege level assigned to said first interface and said second interface to access said memory array is based, at least in part, on contents of the first register and contents of the second register, wherein an interface of the first interface or the second interface with the first privilege level is configured to indicate a busy state in the second register while using the memory array, wherein a requesting interface of the first interface or the second interface with a second privilege level is configured to read the contents of the second register before requesting a change in privilege level, and wherein the requesting interface is configured to request the change in privilege level by writing to the first register.

2. The memory device of claim 1, wherein said memory array includes said first register and said second register.

3. The memory device of claim 1, wherein one of said first interface and said second interface that has a higher privilege level is able to write to said second register, wherein the other of said first interface and said second interface that has a lower privilege level is not able to write to said second register.

4. The memory device of claim 1, wherein a privilege level of one of said first interface and said second interface is higher than a privilege level of the other of said first interface and said second interface.

5. The memory device of claim 1, wherein said memory device comprises a dual-channel memory.

6. The memory device of claim 1, wherein said memory array comprises phase change memory (PCM) cells.

7. The memory device of claim 1, wherein said first interface is adapted to electronically connect to a first host disposed in a mobile device, and said second interface is adapted to wirelessly connect to a second host external to said mobile device.

8. The memory device of claim 1, wherein said first interface and said second interface are configured to be energized using a single power supply.

9. The memory device of claim 1, wherein both the first interface and the second interface comprise parallel interfaces.

10. The memory device of claim 1, wherein the busy state in the second register is indicative of pending erase or write operations.

11. A method of providing access to a memory array, the method comprising:

determining if a first interface of a memory is associated with at least one of a first privilege level or a second privilege level via inspection of contents of a first register, wherein the first register is accessible through the first interface regardless of privilege level;

determining if a second interface of said memory is associated with at least one of the first privilege level or the second privilege level via inspection of contents of the first register, wherein the first register is also accessible through the second interface regardless of privilege level and wherein both said first interface portion and said second interface portion are concurrently enabled;

permitting access to the memory array via at least one of the first interface or the second interface based at least partly on privilege levels associated with the first interface or the second interface;

assigning a privilege level to the first interface or the second interface based, at least in part, on contents of the first register and contents of a second register;

indicating a busy state in the second register while the first interface or the second interface is using the memory array;

prior to receiving a request for a change in privilege level from a requesting interface of the first interface or the second interface, providing the contents of the second register to the requesting interface such that the requesting interface can determine whether or not there are unfinished processes being performed by the other interface; and receiving a request to change privilege level by having the requesting interface write to the first register.

12. The method of claim 11, wherein said first interface portion and said second interface portion are energized using a single power supply.

13. The method of claim 11, further comprising:

assigning one of said first interface portion and said second interface portion to have a highest priority during a simultaneous access to said first register by said first interface portion and said second interface portion.

14. A system comprising:

a memory device comprising:
a memory array;
a first register;
a second register;
a first interface configured to provide access to said memory array and write access to the second register for a first privilege level, but not for a second privilege level, configured to provide access to the first register regardless of privilege level, and configured to provide read access to the second register regardless of privilege level;

a second interface configured to provide access to said memory array and write access to the second register for the first privilege level, but not for the second privilege level, configured to provide access to the first register regardless of privilege level, and configured to provide read access to the second register regardless of privilege level; and a memory controller configured to concurrently maintain said first interface and said second interface in enabled states, wherein a privilege level assigned to said first interface and said second interface to access said memory array is based, at least in part, on contents of the first register and contents of the second register, wherein an interface of the first interface or the second interface with the first privilege level is configured to indicate a busy state in the second register while using the memory array, wherein a requesting interface of the first interface or the second interface with a second privilege level is configured to read the contents of the second register before requesting a change in privilege level, and wherein the requesting interface is configured to request the change in privilege level by writing to the first register; and a processor configured to host one or more applications and to initiate commands to said memory controller to provide access to said memory device.

15. The system of claim 14, wherein one of said first interface and said second interface that has a higher privilege level is able to write to said second register, wherein the other of said first interface and said second interface that has a lower privilege level is not able to write to said second register.

16. The system of claim 14, wherein a privilege level of one of said first interface and said second interface is higher than a privilege level of the other of said first interface and said second interface.

17. The system of claim 14, wherein said first interface is adapted to electronically connect to a first host disposed in a mobile device, and said second interface is adapted to wirelessly connect to a second host external to said mobile device.

18. The system of claim 14, wherein said first interface and said second interface are energized using a single power supply.

19. The system of claim 14, wherein both the first interface and the second interface comprise parallel interfaces.

20. The system of claim 14, wherein the busy state in the second register is indicative of pending erase or write operations.

\* \* \* \* \*